(12) United States Patent
Yu et al.

(10) Patent No.: US 7,098,060 B2
(45) Date of Patent: Aug. 29, 2006

(54) METHODS FOR PRODUCING FULL-COLOR ORGANIC ELECTROLUMINESCENT DEVICES

(75) Inventors: Gang Yu, Santa Barbara, CA (US); Gordana Srdanov, Santa Barbara, CA (US); Matthew Stainer, Goleta, CA (US); Jeffrey Glenn Innocenzo, Towanda, PA (US); Runguang Sun, Shanghai (CN)

(73) Assignee: E.I. du Pont de Nemours and Company, Wilmington, DE (US)

( * ) Notice: Subject to any disclaimer, the term of this patent is extended or adjusted under 35 U.S.C. 154(b) by 138 days.

(21) Appl. No.: 10/643,255

(22) Filed: Aug. 18, 2003

(65) Prior Publication Data

US 2004/0094768 A1 May 20, 2004

Related U.S. Application Data

(60) Provisional application No. 60/408,777, filed on Sep. 6, 2002.

(51) Int. Cl.
*H01L 21/00* (2006.01)

(52) U.S. Cl. ............ 438/29; 438/99; 427/66; 427/68

(58) Field of Classification Search ............ 438/29, 438/99, 21, 57, 149, 164, 237, 328, 466, 438/469; 427/66–70, 164, 165
See application file for complete search history.

(56) References Cited

U.S. PATENT DOCUMENTS

| 6,048,573 | A | 4/2000 | Tang et al. |
| 6,066,357 | A | 5/2000 | Tang et al. |
| 6,087,196 | A | 7/2000 | Sturm et al. |
| 6,366,016 | B1 * | 4/2002 | Sakaguchi et al. .......... 313/506 |
| 6,440,877 | B1 | 8/2002 | Yamazaki et al. |
| 6,566,153 | B1 | 5/2003 | Yang |
| 6,575,800 | B1 | 6/2003 | Kobayashi et al. |
| 6,576,975 | B1 | 6/2003 | Yang |
| 6,633,121 | B1 * | 10/2003 | Eida et al. .................. 313/504 |
| 6,656,519 | B1 * | 12/2003 | Sakaguchi et al. ............ 427/68 |
| 6,737,800 | B1 * | 5/2004 | Winters et al. .............. 313/504 |
| 6,750,792 | B1 * | 6/2004 | Azami et al. ................ 341/100 |
| 6,891,326 | B1 | 5/2005 | Lu |
| 2001/0001050 | A1 | 5/2001 | Miyashita et al. |
| 2002/0197394 | A1 | 12/2002 | Yamazaki et al. |
| 2003/0141810 | A1 | 7/2003 | Kobayashi et al. |
| 2004/0094768 | A1 * | 5/2004 | Yu et al. ..................... 257/79 |

FOREIGN PATENT DOCUMENTS

| EP | 0 756 932 A2 | 2/1997 |
| EP | 0 880 303 A1 | 11/1998 |
| EP | 0 892 028 A2 | 1/1999 |
| EP | 0 989 778 A1 | 3/2000 |
| WO | WO 99/21233 A1 | 4/1999 |
| WO | WO 2004023574 A1 * | 3/2004 |

* cited by examiner

*Primary Examiner*—Laura M. Schillinger (57) ABSTRACT

The invention provides methods for the production of full-color, subpixellated organic electroluminescent (EL) devices. Substrates used in the methods of the invention for production of EL devices comprise wells wherein the walls of the wells do not require surface treatment prior to deposition of electroluminescent material. Also provided are EL devices produced by the methods described herein.

26 Claims, 9 Drawing Sheets

METHODS FOR PRODUCING FULL-COLOR ORGANIC ELECTROLUMINESCENT DEVICES

This patent application claims priority to U.S. provisional application No. 60/408,777, having a filing date Sep. 6, 2002.

FIELD OF THE INVENTION

The invention relates to methods for the production of organic electroluminescent (EL) devices that display full-color images, such as full-color organic light emitting diodes (OLEDs).

BACKGROUND OF THE INVENTION

Organic light emitting diodes (OLEDs) are promising for display applications due to their high power-conversion efficiency and low processing costs. Such displays are especially promising for battery-powered, portable electronic devices, including cell-phones, personal digital assistants, handheld personal computers, and DVD players. These applications call for displays with high information content, full color, and fast video rate response time in addition to low power consumption.

Current research in the production of full-color OLEDs is directed toward the development of cost effective, high throughput processes for producing color pixels. For the manufacture of monochromatic displays, spin-coating processes have been widely adopted (see, e.g., David Braun and Alan J. Heeger, Appl. Phys. Letters 58, 1982 (1991)). However, manufacture of full-color displays requires certain modifications to procedures used in manufacture of monochromatic displays. For example, to make a display with full-color images, each display pixel is divided into three subpixels, each emitting one of the three primary display colors, red, green, and blue. This division of full-color pixels into three subpixels has resulted in a need to modify current processes for depositing different organic polymeric materials onto a single substrate during the manufacture of OLED displays.

One such process for depositing polymer layers on a substrate is ink-jetting (see, e.g., U.S. Patent Application Publication No. 2001/0001050). In order to form an emitting layer with a uniform thickness, proper formulation of the ink and proper design and treatment of the substrate is generally required. However, it has proven quite challenging to properly design and treat substrates to form full-color displays while maintaining suitable device performance (such as efficiency and lifetime). For example, structures used for retaining polymer inks in the subpixels tend to reduce the aperture ratio of a display. In addition, methods used for surface treatment of subpixellated substrates prior to addition of polymer inks can damage the underlying active matrix substrate. Accordingly, there is a need for alternative methods for the cost effective production of full-color EL devices that do not deleteriously effect device performance.

SUMMARY OF THE INVENTION

The invention provides methods for the production of organic electroluminescent (EL) devices. Substrates used in the methods of the invention for production of EL devices do not require $CF_4$ plasma surface treatment prior to deposition of electroluminescent material. Thus, the invention methods are particularly useful in the production of EL devices where ink-jetting is used to deposit electroluminescent material. In addition, the invention methods are useful for producing both subpixellated and non-subpixellated devices. Moreover, the invention methods are useful for producing EL devices which contain one type of EL material or several types of EL material.

In another embodiment of the invention, there are provided organic EL devices produced by providing a substrate, depositing an anode layer onto the substrate, establishing a plurality of discreet wells on the substrate, wherein the discreet wells are formed by circumscribing walls to form the wells, depositing an un-patterned buffer layer onto the anode layer in each of the wells, depositing an un-patterned EL host polymer layer into each of said wells, depositing at least one patterned dopant layer in at least one of said wells without prior surface treatment of the walls of the well, and depositing a cathode layer, thereby producing an organic electroluminescent (EL) device.

In still another embodiment of the invention, there are provided full-color, subpixellated organic EL devices produced by providing a substrate, depositing an anode layer onto the substrate, establishing a plurality of discreet wells in sets of three on the substrate, wherein the discreet wells are formed by circumscribing walls to form the wells, wherein each well defines a subpixel and each set of three wells defines a pixel, depositing an un-patterned buffer layer onto the anode layer in each of the wells, depositing an un-patterned EL host polymer layer selected to produce blue light in each of the wells, depositing a first patterned dopant layer selected to produce red light in a first well in at least one of the set of three wells without prior surface treatment of the walls of the well, depositing a second patterned dopant layer selected to produce green light in a second well in at least one of the set of three wells without prior surface treatment of the walls of the well, and depositing a cathode layer, thereby producing an electroluminescent device.

In yet another embodiment, there are provided electroluminescent devices including a substrate having a plurality of discreet wells, wherein each of the discreet wells has at least one wall surface that is substantially free of fluorine.

In still another embodiment, the present invention relates to electroluminescent devices having a plurality of first and second subpixels, containing at least one layer of electroluminescent polymer, wherein the electroluminescent polymer layer in at least one of the first subpixels has diffused therein a first dopant, and the electroluminescent polymer layer in at least one of the second subpixels has diffused therein a second dopant, and the at least one first subpixel exhibits a photoluminescence spectrum displaying emission only from the first dopant, and the at least one second subpixel exhibits a photoluminescence spectrum displaying emission only from the second dopant.

BRIEF DESCRIPTION OF THE FIGURES

The invention is illustrated by way of example and not limitation in the accompanying figures.

DETAILED DESCRIPTION OF THE INVENTION

Methods are provided for the production of organic electroluminescent devices. In one embodiment, there is provided a method for producing an organic electroluminescent (EL) device comprising:

a) providing a substrate, b) depositing an anode layer onto said substrate, c) establishing a plurality of discreet wells on said substrate, wherein said discreet wells are formed by circumscribing walls to form said wells, d) depositing an un-patterned buffer layer onto said anode layer in each of said wells, e) depositing an un-patterned EL host polymer layer into each of said wells, f) depositing at least one patterned dopant layer in at least one of said wells without prior surface treatment of said walls of said well, and g) depositing a cathode layer, thereby producing an organic electroluminescent (EL) device.

In another embodiment, there is provided a method for producing a full-color, subpixellated organic electroluminescent (EL) device, the method comprising:

a) providing a substrate, b) depositing an anode layer onto said substrate, c) establishing a plurality of discreet wells in sets of three on said substrate, wherein said discreet wells are formed by circumscribing walls to form said wells, wherein each well defines a subpixel and each set of three wells defines a full-color pixel, d) depositing an un-patterned buffer layer onto said anode layer in each of said wells, e) depositing an un-patterned EL host polymer layer selected to produce blue light in each of said wells, f) depositing a first patterned dopant layer selected to produce red light in a first well in at least one of said set of three wells without prior surface treatment of said walls of said well, g) depositing a second patterned dopant layer selected to produce green light in a second well in at least one of said set of three wells without prior surface treatment of said walls of said well, h) depositing a cathode layer, thereby producing a full-color, subpixellated organic electroluminescent device.

As used herein, the term "dopant" refers to a material suitable to alter the light emitting properties of an un-doped host material.

As used herein, the term "un-patterned", when used in conjunction with an organic layer used in the production of an EL device, means that the organic layer has been deposited across the entire pixel array, as opposed to being deposited in a specific pattern across the pixel array.

As used herein, the term "patterned", when used in conjunction with a dopant layer used in the production of an EL device, means that the dopant is deposited into specified wells within specified pixels across the pixel array.

As used herein, the phrase "surface treatment" refers to a process commonly used in the art to modify the wetting properties of the walls of wells in subpixellated EL devices. "Surface treatment" refers to exposure to a dry plasma, using $CF_4$ gas after the wells are formed with walls made of organic materials, such as photoresists or acrylic resins. As a result of such surface treatment, the surface of the substrate and the walls of the wells are substantially fluorinated. As used herein, the term "fluorinated" means that fluorine is associated with the surface of the substrate. Fluorine may be associated with the surface in a number of ways, for example, the fluorine may be physically adsorbed onto the surface, chemically bonded to the surface, and the like. Indeed, those skilled in the art recognize that a chemical analysis of a surface treated with $CF_4$ would show the presence of fluorine. It is commonly known that plasma $CF_4$ treatment can damage the underlying electronic components in an active matrix EL device, a process that limits useable process conditions for substrates containing active matrix pixel drivers.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

FIG. 1 illustrates one embodiment of the invention for producing full-color EL devices. The substrate is either embedded with microcircuitry (active matrix substrate) or has no embedded microcircuitry (passive matrix substrate). In FIG. 1A, a rigid or flexible substrate 10 is provided with a patterned anode layer 20, and then walls 30 are provided so as to form a plurality of wells in sets of three on the substrate. The wells may have any convenient shape, for example, rectangular, circular (including oval-shaped), triangular, and the like. In one embodiment, the walls form rectangular wells. Each well contains an anode and forms a subpixel, and each set of three wells forms a pixel. The walls may be constructed from organic material such as epoxy resin, acrylic resin, polyimide resin, and the like, or the walls may be constructed from inorganic material such as glass. Conventional photolithography techniques may be used to form the pattern of walls and wells. Upon complete fabrication of the device, the three subpixels will emit the three primary display colors, i.e., red, green, and blue. Electronic devices containing subpixels improve the contrast of a device and prevent light from leaking between pixels.

Figure 1A:
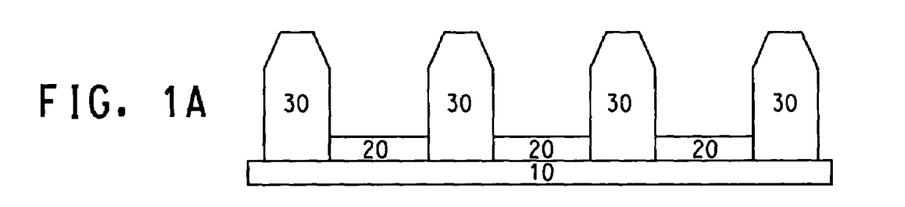
FIGS. 1–3 illustrate exemplary alternative device structures prepared according to the methods of the invention.
Figure 1B:
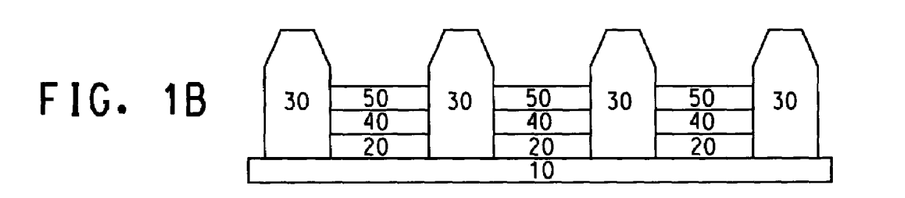

The anode surface is then cleaned to remove surface contaminants using methods well known to those skilled in the art (for example, see U.S. Pat. No. 5,798,170). As shown in FIG. 1B, an un-patterned buffer layer 40 is deposited onto the anode layer 20, and an un-patterned blue EL polymer layer 50 is then coated over the entire active area (i.e., all of the subpixels) by methods well-known to those skilled in the art e.g., spin coating, silk-screen printing, and the like. By depositing the un-patterned buffer layer 40 and un-patterned blue EL polymer layer 50 over the entire active area, the need for plasma surface treatment of the walls is obviated. In addition to providing the emission for the blue subpixels, the un-patterned blue EL polymer layer can serve as a host to receive green and red dopants in their respective subpixels for formation of a full-color display.

Figure 1C:
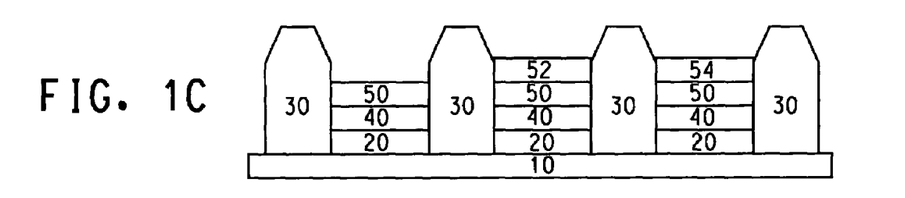
Figure 1D:
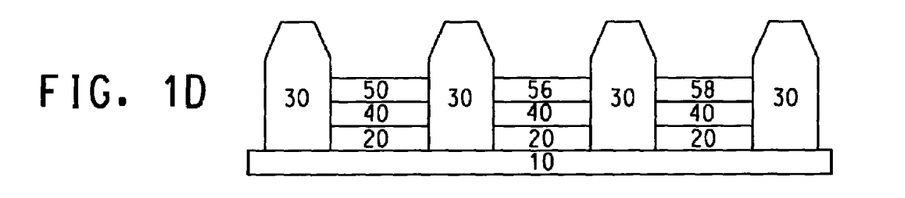
Figure 1E:
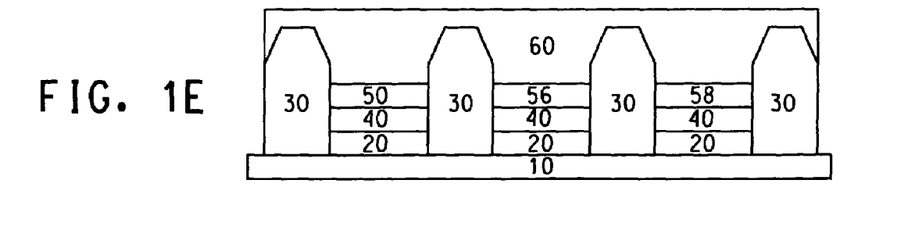
Figure 2A:
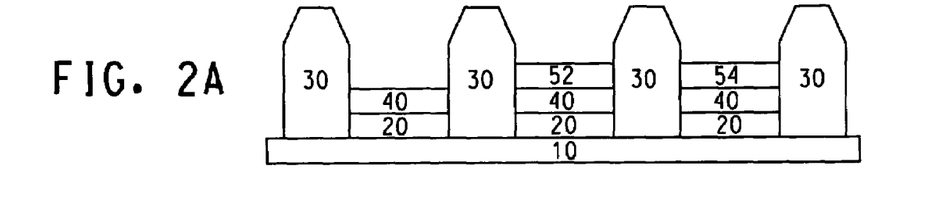
Figure 2B:
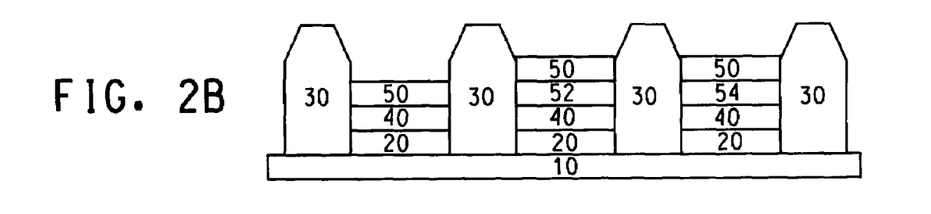
Figure 2C:
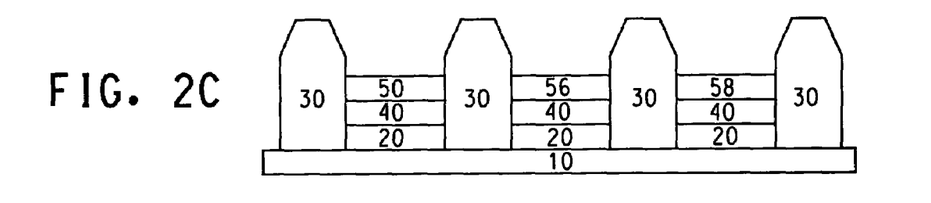
Figure 2D:
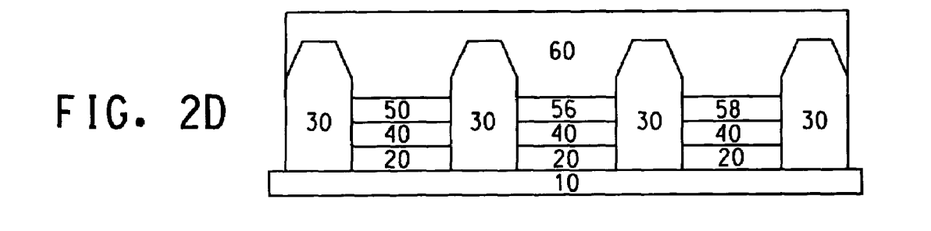

As shown in FIG. 1C, subpixels that emit green and red light are next formed by ink-jetting drops of polymer solutions containing green dopant into a first set of subpixels and ink-jetting drops of polymer solutions containing red dopant into a second set of subpixels to form the green 52 and red 54 EL polymer layers. The polymer solutions contain small amounts of green and red dopants in a polymer host material, wherein the polymer host material is the same polymer used for the un-patterned blue EL polymer layer 50. Through wetting by the green and red polymer solutions of the unpatterned blue EL polymer layer, blend layers 56 and 58 (FIG. 1D) with uniform (monolayer) or gradient density distributions of green and red dopants can be formed in the green and red subpixels. Finally, as shown in FIG. 1E, a cathode material 60 is deposited over the entire surface to complete the device.

As used herein, the term "monolayer" refers to a host EL polymer having a dopant diffused therein with a uniform density distribution, wherein the photoluminescence spectrum of the host EL polymer containing dopant diffused therein displays emission from the dopant only.

As used herein, the term "blend layer" refers to an EL polymer layer that is formed when the same EL polymer is used in consecutive deposition steps, doped or undoped, for the purpose of introducing specific dopants into the layer that alter the characteristic luminescence of that layer. The blend layer can have a gradient density distribution and exhibit the characteristic photoluminescence of both the host and the dopant, or it can have the uniform density distribution of a monolayer as defined above.

FIG. 2 illustrates another embodiment of the invention methods for producing full-color EL devices. After formation of subpixels, anode, and buffer layers as described above with reference to FIG. 1, patterned green and red polymer layers 52 and 54 may be deposited into two of the three wells in a pixel, FIG. 2A, before an un-patterned blue EL polymer 50 is deposited, FIG. 2B. In this embodiment, it is the un-patterned buffer layer 40 coating alone that prevents wetting of the walls by the dopant layers when they are deposited in the subpixels. As in the previous embodiment, the host polymer for the green and red dopants is the same polymer used for the un-patterned blue EL polymer layer 50. Through wetting of the dopant layers 52 and 54 by the un-patterned blue EL polymer layer 50, blend layers 56 and 58 can be formed, FIG. 2C. A cathode layer 60 is deposited to complete the device, FIG. 2D.

Figure 3:
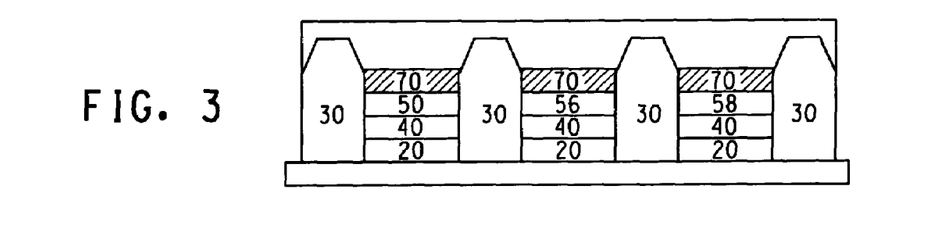

Yet another embodiment of the invention methods is shown in FIG. 3. An additional un-patterned organic layer 70, which conducts electrons and may or may not emit light, is coated before the cathode 60 and after the EL polymer layers 50, 56 and 58. This additional layer, which lies adjacent to the cathode layer 60, facilitates injection and transport of electrons from the cathode into the EL polymer and/or eliminates EL quenching due to the cathode.

The manufacture of EL devices according to the invention is advantageous for several reasons. For example, blue pixels and blue subpixels are formed by an un-patterned deposition process (e.g., spin coating). Thus, emission homogeneity and device performance are both optimized. In addition, the process time for formation of each of the polymer layers is markedly reduced by eliminating ink-jet processing time and setting time for the buffer and blue EL polymer layers. This further reduction in process time also contributes to improved device performance (both efficiency and operation life).

Moreover, the gradient density profile in the green and red subpixels is readily tuned by the wetting process when a dopant is deposited from solution using the same host polymer as used for the un-patterned blue EL polymer layer. This tuning provides an effective means to optimize emission of the OLED and thus the device performance. Indeed, since the same blue light-emitting EL materials used for blue subpixels are used as host materials for green and red subpixels, the intensity vs. voltage dependence of the red, green and blue subpixels follows the same trends. This feature creates an ideal situation for color balance and compensation in full-color displays by simplifying corresponding driving circuits. The optional un-patterned organic layer 70 adjacent to the cathode layer 60 in FIG. 3 facilitates injection and transport of electrons into the EL layer, thereby providing an additional means for optimizing device performance.

The diffusion of the green and red dopants into the blue EL host polymer can be uniform and complete. Indeed, as set forth in Examples 6, 7, 8, 10, 11 and 12 and in FIG. 10, the inventive EL devices contain green and red subpixels which exhibit photoluminescence spectra displaying emission from the green and red dopants only. Thus, in one embodiment of the invention, there are provided EL devices comprising a substrate, an anode layer, an electroluminescent polymer layer selected to produce blue light, and a cathode layer, wherein in at least one first subpixel the electroluminescent polymer layer has diffused therein a first dopant selected to produce red light and in at least one second subpixel the electroluminescent polymer layer has diffused therein a second dopant selected to produce green light, wherein the at least one first subpixel exhibits a photoluminescence spectrum displaying emission only from the first dopant, and the at least one second subpixel exhibits a photoluminescence spectrum displaying emission only from the second dopant. Those skilled in the art recognize that the methods of this invention are not limited to producing red, green, and blue subpixellated full-color displays, but can be used to form any number of subpixels with any combination of characteristic emissions, based on the properties of the electroluminescent materials used.

Furthermore, when EL devices are produced according to the methods of the invention, there is no need for surface treatment of the substrate prior to deposition of either the un-patterned blue EL polymer or the red and green dopant materials. Those skilled in the art recognize that plasma surface treatment of wells prior to deposition of polymer layers can damage the underlying substrate and especially damage the transistors embedded in the substrate of an active matrix device. Indeed, the surfaces of the walls of the wells employed in the invention EL devices are substantially free of fluorine. As used herein, the phrase "substantially free of fluorine" means that the surfaces contain an amount of fluorine which is normally present, based on the composition of the materials, and is to be distinguished from an amount of fluorine that would be present on the surface after surface treatment with $CF_4$.

Substrates 10 contemplated for use in the practice of the invention can be flexible or rigid, organic or inorganic.

Generally, glass or organic films in either rigid or flexible form are used as a support. The anode layer 20 is an electrode that is more efficient for injecting holes compared to the cathode layer. The anode can include materials containing a metal, mixed metal, alloy, metal oxide or mixed oxide. Suitable materials include, but are not limited to, the mixed oxides of the Group 2 elements (i.e., Be, Mg, Ca, Sr, Ba, Ra), the Group 11 elements, the elements of Groups 4, 5, and 6, and the Group 8–10 transition elements. Group numbers corresponding to columns within the periodic table of the elements use the "New Notation" convention as seen in the *CRC Handbook of Chemistry and Physics*, 81$^{st}$ Edition (2000).

If the anode layer is to be light transmitting in the visible spectral range, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for the anode layer include indium-tin-oxide ("ITO"), aluminum-tin-oxide, gold, silver, copper, and nickel. The anode may also comprise an organic material, such as a conducting polyaniline (G. Gustafsson, Y. Cao, G. M. Treacy, F. Klavetter, N. Colaneri, and A. J. Heeger, Nature 357, 477 (1992)), PEDOT-PSSA (Y. Cao, G. Yu, C. Zhang, R. Menon and A. J. Heeger, Synth. Metals, 87, 171 (1997)) and polypyrrole-4-dodecylbenzenesulfonic acid (DBSA) (J. Gao, A. J. Heeger, J. Y. Lee and C. Y. Kim, Synth. Metals 82, 221 (1996)).

The anode layer may be formed by a chemical or physical vapor deposition process or by a spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer is patterned using a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices form a passive matrix array, the anode layer typically is formed into substantially parallel strips having lengths that extend in substantially the same direction. In an active matrix array, the anode layer is patterned to form a discrete electrode for each electronic device, or subpixel.

The buffer layer 40 functions to facilitate injection of holes into the EL polymer layer and to smoothen the anode surface to prevent shorts in the device. Buffer layers are typically polymeric materials, such as polyaniline (PANI) or polyethylenedioxythiophene (PEDOT), which are often doped with protonic acids, or can be organic charge transfer compounds, and the like, such as the tetrathiafulvalene-tetracyanoquinodimethane system (TTF-TCNQ). Protonic acids contemplated for use in the practice of the invention include, for example, poly(styrenesulfonic acid), poly(2-acrylamido-2-methyl-1-propanesulfonic acid), and the like. The buffer layer is usually cast onto substrates using a variety of techniques well known to those skilled in the art. Typical casting techniques include, for example, solution casting, drop casting, curtain casting, spin-coating, screen printing, inkjet printing, and the like. Alternatively, the buffer layer can be patterned using a number of such processes, such as ink-jet printing.

The electroluminescent (EL) layer 50 may typically be a conjugated polymer such as poly(paraphenylenevinylene) (PPV), PPV copolymers, polyfluorenes, polyphenylenes, polyacetylenes, polyalkylthiophenes, and the like. The particular material chosen may depend on the specific application, voltage potentials used during operation, or other factors. The EL layer can also be made with oligomers or dendrimers Dopants contemplated for use in the practice of the invention are typically organometallic materials. Exemplary metals contemplated for use include lanthanide metals (e.g., Eu, Tb), Group 7 metals (e.g., Re), Group 8 metals (e.g., Ru, Os), Group 9 metals (e.g., Rh, Ir), Group 10 metals (e.g., Pd, Pt), Group 11 metals (e.g., Au), Group 12 metals (e.g., Zn), Group 13 metals (e.g., Al), and the like. In one embodiment, the organometallic materials may be cyclometallated complexes of Ir or Pt, with ligands such as phenylpyridines. Typical cyclometallated complex dopants contemplated for use in the practice of the invention are disclosed in published PCT application WO 02/2714, the entire contents of which are incorporated herein by reference. In another embodiment, the organometallic materials may be functionalized polymers comprising functional groups coordinated to at least one metal. The metals may be those discussed above. Exemplary functional groups contemplated for use include carboxylic acids, carboxylic acid salts, sulfonic acid groups, sulfonic acid salts, groups having an OH moiety, amines, imines, diimines, N-oxides, phosphines, phosphine oxides, β-dicarbonyl groups, and the like. Typical polymeric organometallic dopants contemplated for use in the practice of the invention are disclosed in Published PCT Application No. WO 02/31896, the entire contents of which are incorporated herein by reference.

Dopants contemplated for use in the practice of the invention can also be an organic dye molecule such as 4-dicyanmethylene-2-methyl-6(p-dimethyaminostyryl)-4H-pyran (DCM), coumarin and the like. Dopants contemplated for use in the practice of the invention can also be a red or green EL polymer in conjugated or non-conjugated form.

When used for the production of full-color EL devices, a first dopant is selected to emit red light (with emission profile dominating in 600–700 nm range) and a second dopant is selected to emit green light (with emission profile dominating in 500–600 nm range). After deposition of each of the dopants, each pixel column contains three subpixels wherein one subpixel emits red light, one subpixel emits green light, and one subpixel emits blue light (with emission profile dominating in 400–500 nm range).

As shown in FIG. 3, an optional un-patterned layer 70 may be deposited prior to deposition of the cathode layer. This optional layer can function both to facilitate electron injection/transport, and also serve as a confinement layer to prevent quenching reactions at layer interfaces. More specifically, this layer may promote electron mobility and reduce the likelihood of a quenching reaction if the EL polymer layer and the cathode layer would otherwise be in direct contact. Examples of materials for this optional un-patterned layer include metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)4-phenyl-5-(4-t-butylphenyl)-1,2,4-triazole ("TAZ" or the like); other similar compounds; or any one or more combinations thereof. Alternatively, the optional unpatterned layer may be inorganic and comprise BaO, LiF, Li$_2$O, or the like. This optional unpatterned layer can also be an oligomer, dendrimer or conjugated polymer. Examples of conjugated polymers for this layer are provided in Published PCT Application No. WO 01/77203.

The cathode layer 60 is an electrode that is particularly efficient for injecting electrons or negative charge carriers. The cathode layer can be any metal or nonmetal having a lower work function than the first electrical contact layer (in this case, the anode layer). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). In one embodiment, the cathode comprises materials such as aluminum, indium, yttrium, barium, lithium, cerium, cesium, europium, rubidium, magnesium, samarium, and combinations thereof. The cathode can also be a metal alloy, for example, BaAl, LiAl, CaAl, CaIn, and the like, or can be in a multiple layer form with each layer containing a different metal or metal alloy composition. In this case, only the layer adjacent to the organic emission layer or optional electron transport layer requires a lower work function. The thickness of the first layer is typically in the range of 1–300 nm.

The cathode layer is usually formed by a chemical or physical vapor deposition process. The cathode layer can be patterned, as discussed above in reference to the anode layer, or un-patterned. If the device lies within a passive matrix array, the cathode layer may be patterned into substantially parallel strips, where the lengths of the cathode layer strips extend in substantially the same direction and substantially perpendicular to the lengths of the anode layer strips. The pixels are formed at the cross points (where an anode layer strip intersects a cathode layer strip when the array is seen from a plan or top view). If the device lies within an active matrix array, the cathode can be un-patterned, or monolithic, with the pixels and subpixels defined by the patterning of the anode layer.

The different layers may have any suitable thickness. The inorganic anode layer is usually no greater than approximately 500 nm, for example, approximately 10–200 nm; the buffer layer is usually no greater than approximately 500 nm, for example, approximately 20–200 nm; the EL layer is usually no greater than approximately 200 nm, for example, approximately 10–80 nm; the optional un-patterned layer is usually no greater than approximately 100 nm, for example, approximately 20–80 nm; and the cathode layer is usually no greater than approximately 1000 nm, for example, approximately 50–500 nm. If the anode layer or the cathode layer needs to transmit at least some light, the thickness of such layer may not exceed approximately 100 nm.

In organic light emitting diodes (OLEDs), electrons and holes, injected from the cathode and anode layers, respectively, into the EL layer, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 15 volts, and in many instances no greater than approximately 5 volts, may be applied to the device. The actual potential difference may depend on the use of the device in a larger electronic component. In many embodiments, the anode layer is biased to a positive voltage and the cathode layer is at substantially ground potential or zero volts during the operation of the electronic device. A battery or other power source(s) may be electrically connected to the electronic device as part of a circuit.

The invention will now be described in greater detail by reference to the following non-limiting examples.

EXAMPLES

The following specific examples are meant to illustrate and not limit the scope of the invention.

Example 1

OLEDs according to the invention were fabricated in the following order:

ITO/buffer polymer/EL polymer/cathode

The substrates were 30×30 mm ITO coated glass. The buffer layer was a PEDOT material (BAYTRON-P, Bayer AG, Germany). The EL polymers were polyfluorene derivative blue and green materials (Blue-1, Blue-2, Blue-3, Green-1), or bis-cyclometallated iridium complexes (Ir-R1) for red emission. The EL polymer layer was spin-coated to a thickness of 77–100 nm. Toluene was used for the solution casting of the blue and green EL materials and dichloromethane was used for the solution casting of red Ir complex EL materials. The cathode used was 3.5 nm Ba with 500 nm Al.

Green and blue reference devices with a single coating of EL polymer were also fabricated for comparison. The reference devices were made by spin-coating the EL polymer in a 1–1.5% solution of polymer in toluene followed by immediate cathode deposition.

For the "bilayer" devices, a thin layer (30–40 nm) of the blue EL polymer was spin-coated, and the layer was annealed for 10 minutes at 60° C. followed by spinning of the second layer (40–50 nm). For the red device, the second layer was applied as a toluene solution of a polymer containing up to 5% (50 mg in 1 ml of solution) of an Ir complex red emitter in the same blue polymer host as the blue layer.

Figure 4:
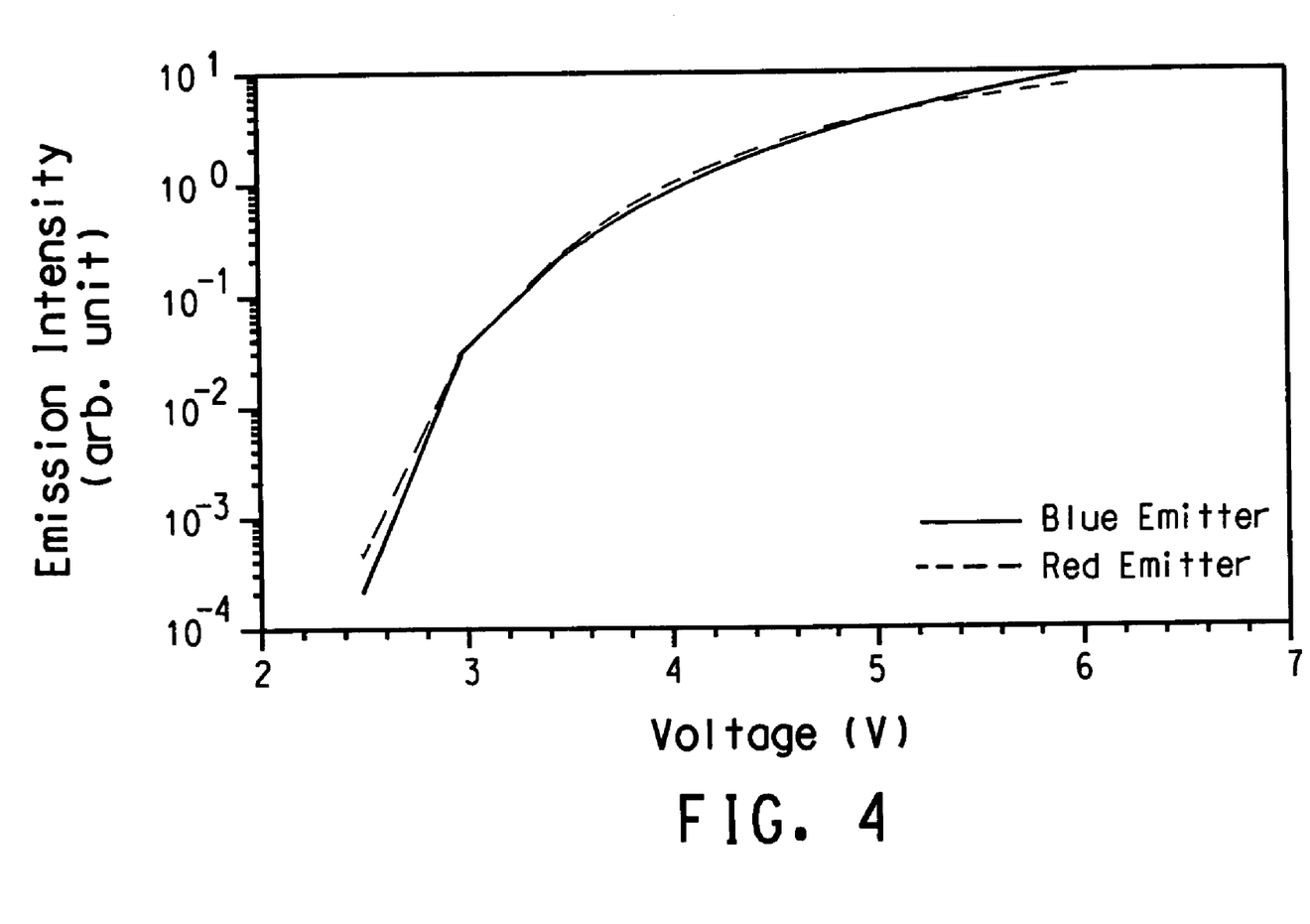
FIG. 4 illustrates intensity voltage dependence of a blue pixel (single layer) and a red pixel (bilayer) processed by coating blue and red polymers.

Device performance is summarized in Table 1. The data demonstrate that one can use a double layer configuration without sacrificing efficiency or operation voltage. In fact, the structures depicted in FIGS. 1–3 provide a unified relationship between emission intensity and operation voltage. FIG. 4 illustrates the intensity-voltage dependence of a blue pixel (single layer) and a red pixel (bilayer) processed by coating blue and red polymers. This unique intensity-voltage dependence allows a simple circuit for color balance and generalized gamma-curve correction.

TABLE 1

Device performance for (RGB) single and bilayer devices at 200 cd/m²

| Device ID | Structure | Voltage (V) | EL efficiency (cd/A) | EL Color |
|---|---|---|---|---|
| 1A | Blue-1 | 7.0 | 1.5 | blue |
| 1B | Blue-1 | 6.4 | 1.8 | blue |
| 1C | Blue-1/Blue-2 | 5.9 | 1.6 | blue |
| 1D | Blue-2 | 4.7 | 3.0 | blue |
| 1E | Blue-2 | 5.2 | 3.7 | blue |
| 1F | Green-1 | 4.9 | 4.4 | green |
| 1G | Blue-1/Green-1 | 4.5 | 4.7 | green |
| 1H | Blue-1/Green-1 | 4.5 | 4.4 | green |
| 1I | Blue-2/Green-1 | 4.1 | 3.0 | green |
| 1J | Blue-2/Ir-R1 | 5.2 | 1.2 | red |
| 1K | Blue-2/Ir-R1 | 5.7 | 0.7 | red |
| 1L | Blue-2/Ir-R1 | 5.5 | 0.8 | red |
| 1M | Blue-1/Ir-R1 | 6.3 | 0.8 | red |
| 1N | Blue-2/Blue-3, Ir-R1 | 6.8 | 1.5 | red |
| 1O | Blue-3, Ir-R1 | 10.0 | 1.3 | red |

Figure 5:
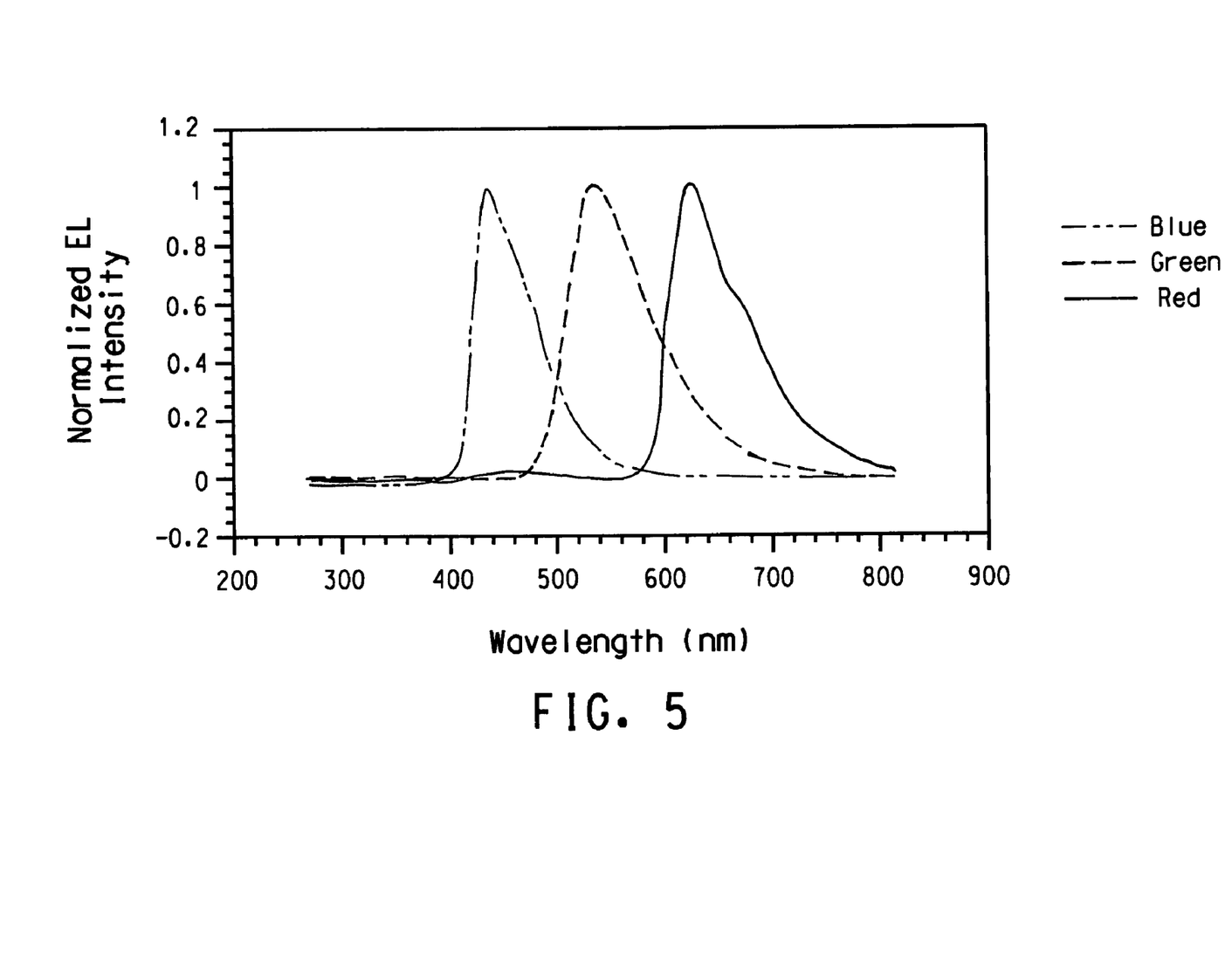
FIG. 5 illustrates EL emission spectra with single layer EL polymers.
Figure 6:
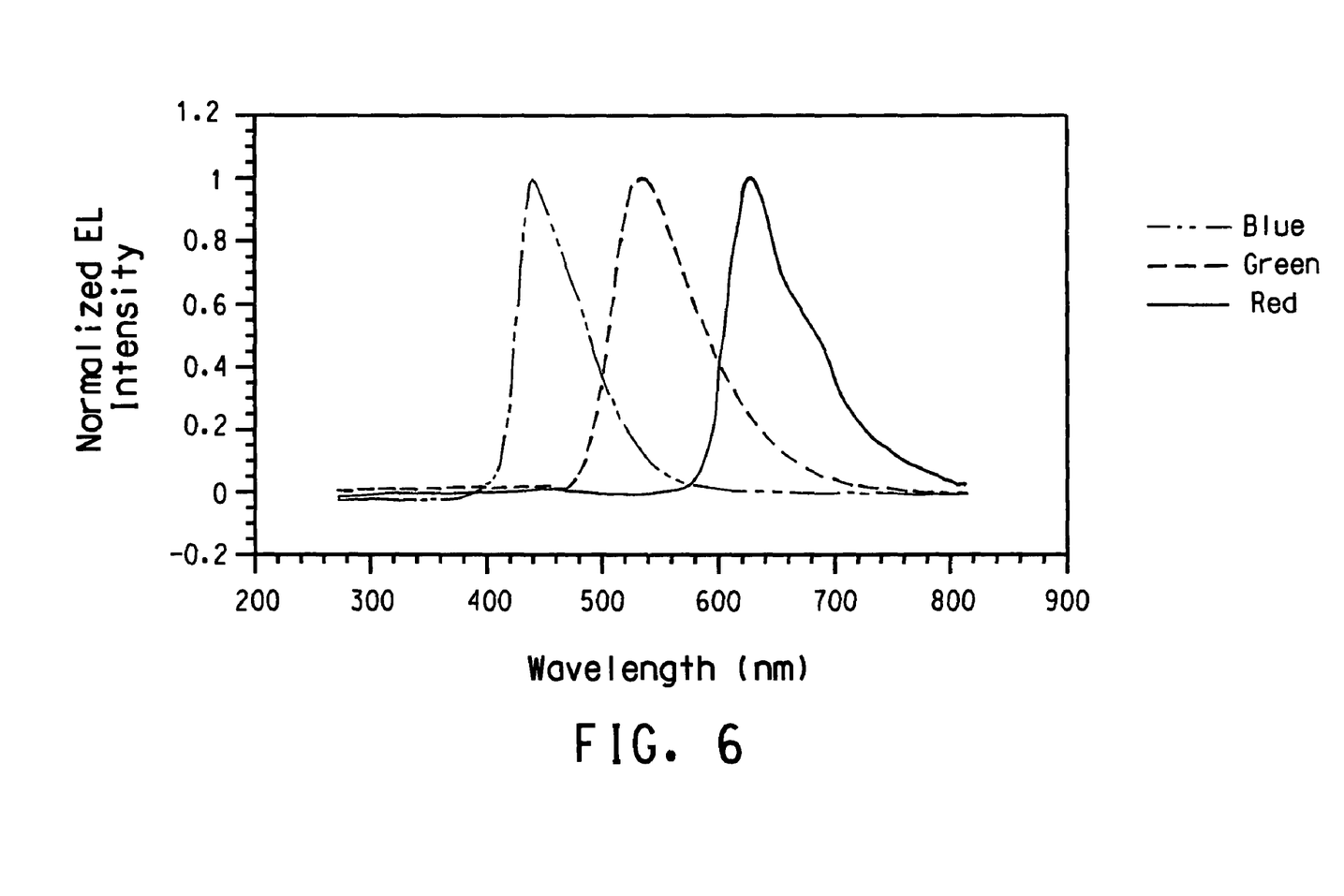
FIG. 6 illustrates EL emission spectra produced by a device with the structure shown in FIG. 1.

In addition, EL spectra for single layer and bilayer devices are shown in FIGS. 5 and 6, respectively. Red, green and blue emissions, which form the fundamental color subpixels in full-color displays, were demonstrated.

Example 2

In this Example, devices were fabricated as in Example 1, but with a spin-coated cyano-poly(p-phenylene) (CN-PPP) blue layer (~70 nm). The green devices were produced by vapor deposition of a green dopant molecule (Coumarin 545T, Eastman Kodak Co., Rochester, N.Y.) over the blue EL polymer layer. One of the devices was treated under toluene solvent vapor to let the green dopant diffuse into the blue EL polymer host. Another device was heated to allow the dopant to diffuse into the host. The cathode was prepared as in Example 1. Red devices were prepared in the same manner as the green devices, using a red dopant (DCJTB, Eastman Kodak Co.). The results are summarized in Table 2.

TABLE 2

Device performance for (RGB) single layer devices

| Device ID | Structure | Voltage (V) | EL intensity (cd/m²) | EL Color |
|---|---|---|---|---|
| 2A | CN-PPP/Ba/Al | 9 | 12 | blue |
| 2B | CN-PPP:C545T/LiF/Al | 16 | 2 | green |
| 2C | CN-PPP:DCJTB/LiF/Al | 18 | 2 | red |

Figure 7:
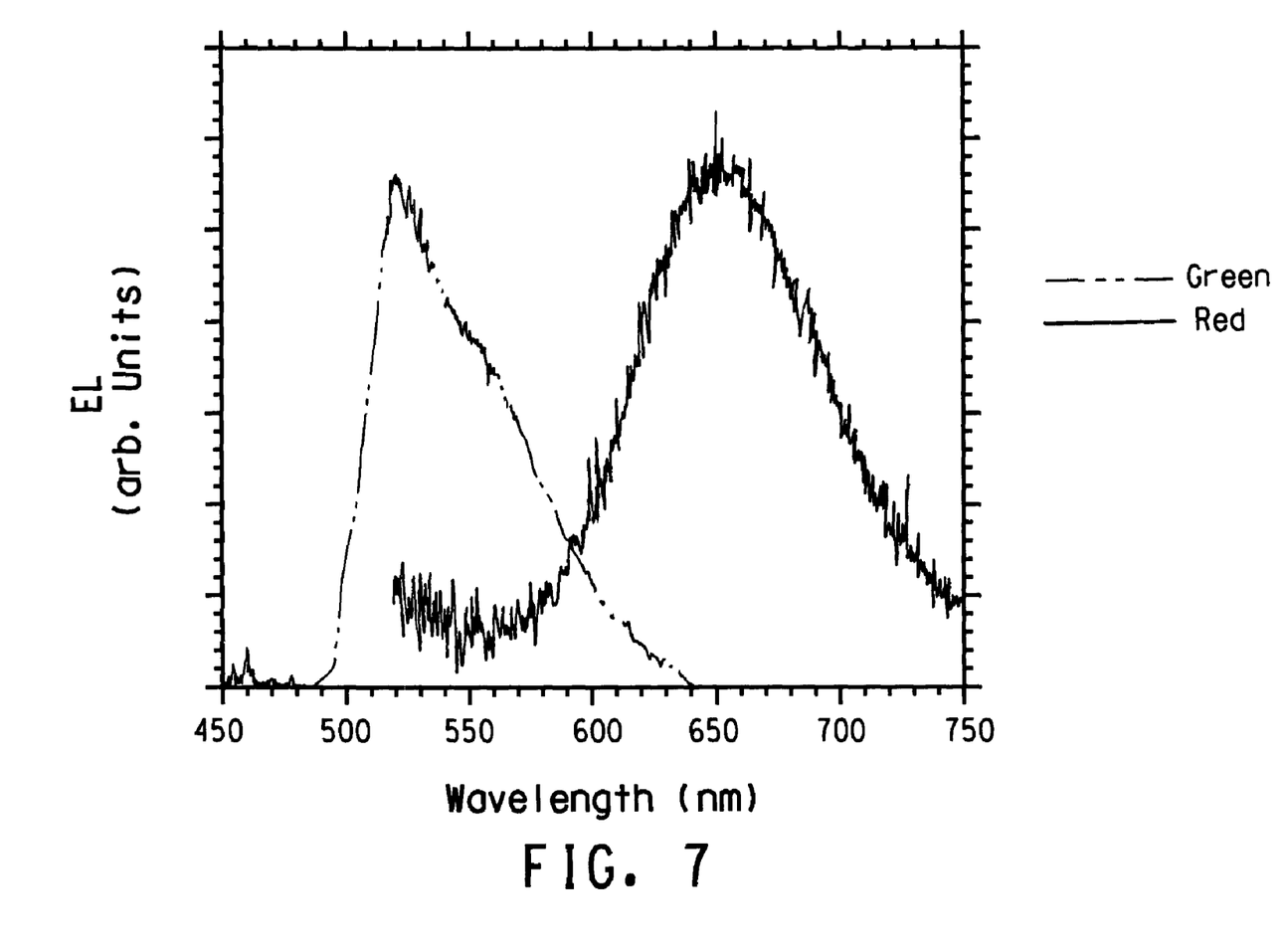
FIG. 7 illustrates EL spectra with single layer EL polymers doped with fluorescent dopants: green dopant C545T (peak maxima ~520 nm) and red dopant DCJTB (peak maxima ~650 nm.

EL emission spectra produced by single layer EL polymers doped with fluorescent dopants are shown in FIG. 7. This example demonstrated that green and red pixels can be prepared by depositing dopant molecules on top of a blue EL polymer layer. Diffusing a layer into a single organic layer with a desired density profile can be achieved by post heating or solvent vapor treatment.

Example 3

Example 1 was repeated using a soluble poly(aryloxadiazole) conjugated polymer to form a continuous, un-patterned electron transport layer before the cathode was deposited. Its thickness was 20–30 nm. The cathode materials used in this experiment were calcium and aluminum.

Red, green, and blue color emissions were observed in the corresponding devices. The emission spectra were the same as those shown in FIG. 6. The operating voltages and EL efficiencies from Ca devices can be better than those in the Ba devices used in Example 1.

This example demonstrated that high efficiency RGB OLEDs can be fabricated with cathode materials with higher work functions than those most commonly used. Air stable cathodes (such as Al) can be used for full-color PLED displays.

Example 4

Figure 8:
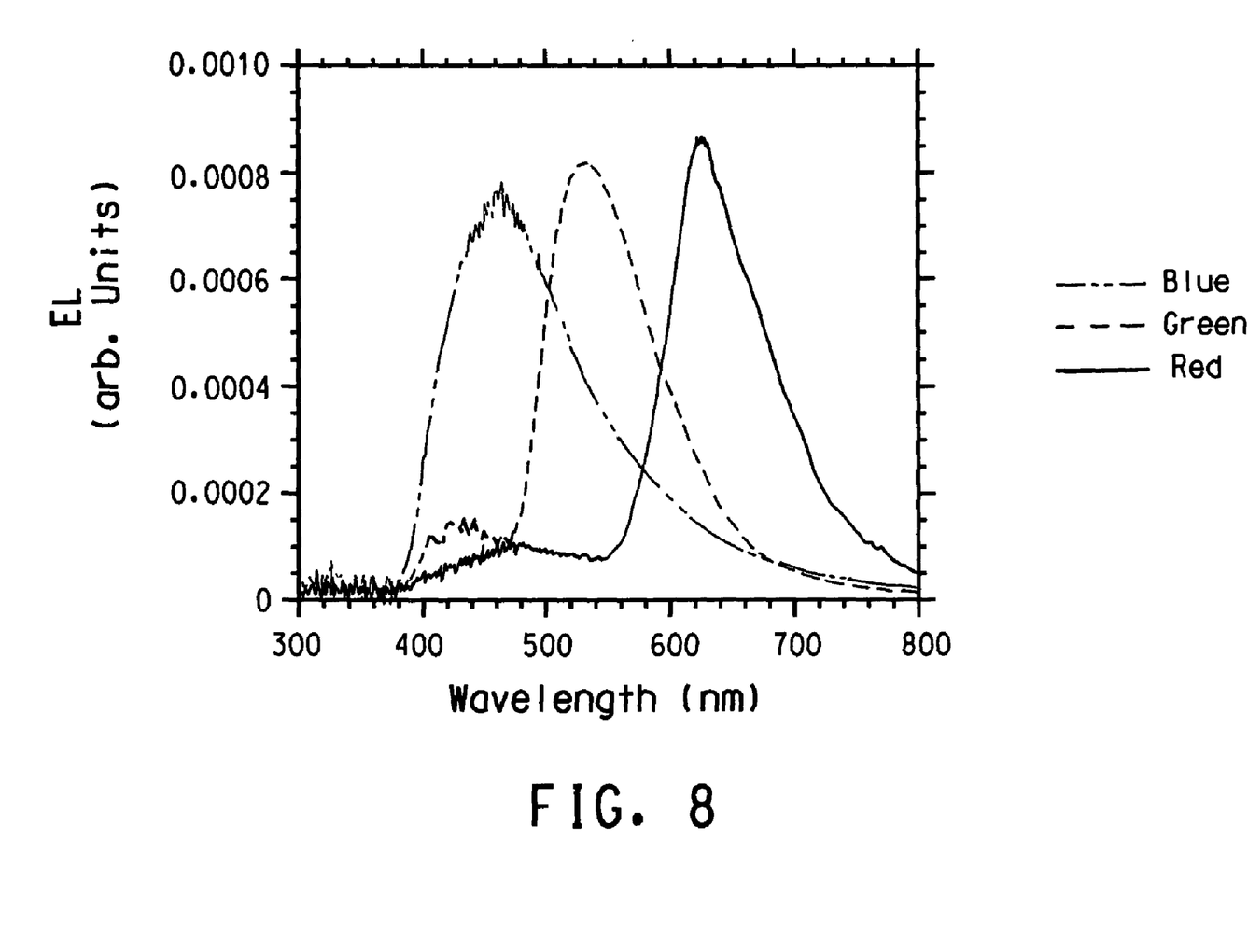
FIG. 8 illustrates EL spectra with single layer polymers doped with green and red fluorescent Ir complexes.

In this example, devices were fabricated as in example 1, but with a CN-PPP spin-coated blue layer (~70 nm). Green emitters were obtained by spin-coating a green Ir complex dopant (Ir-G1) (see, Y. Wang et al., Appl. Phys. Lett. 79, 449 (2001)) over the blue polymer layer. Red devices were also made according to the same procedure but the green dopant was replaced with a red Ir complex dopant (Ir-R2) (similar to that in Example 1). The emission spectra of these devices are shown in FIG. 8. The corresponding EL efficiencies are shown in Table 3.

TABLE 3

Device performance for (RGB) single layer devices

| Device ID | Structure | Voltage (V) | EL intensity (cd/m²) | EL Color |
|---|---|---|---|---|
| 4A | CN-PPP/Ba/Al | 9 | 12 | blue |
| 4B | CN-PPP:Ir-G1/Ba/Al | 9 | 10 | green |
| 4C | CN-PPP:Ir-R2/Ba/Al | 15 | 6 | red |

This example demonstrates that the green and red emitters can be made by coating a phosphorescent dopant molecule onto a blue EL polymer layer using a solution process (such as drop coating, jetting, etc.). Single green and red EL blend layers with desired density profiles can be achieved by proper selection of solvent and process conditions.

Example 5

Figure 9:
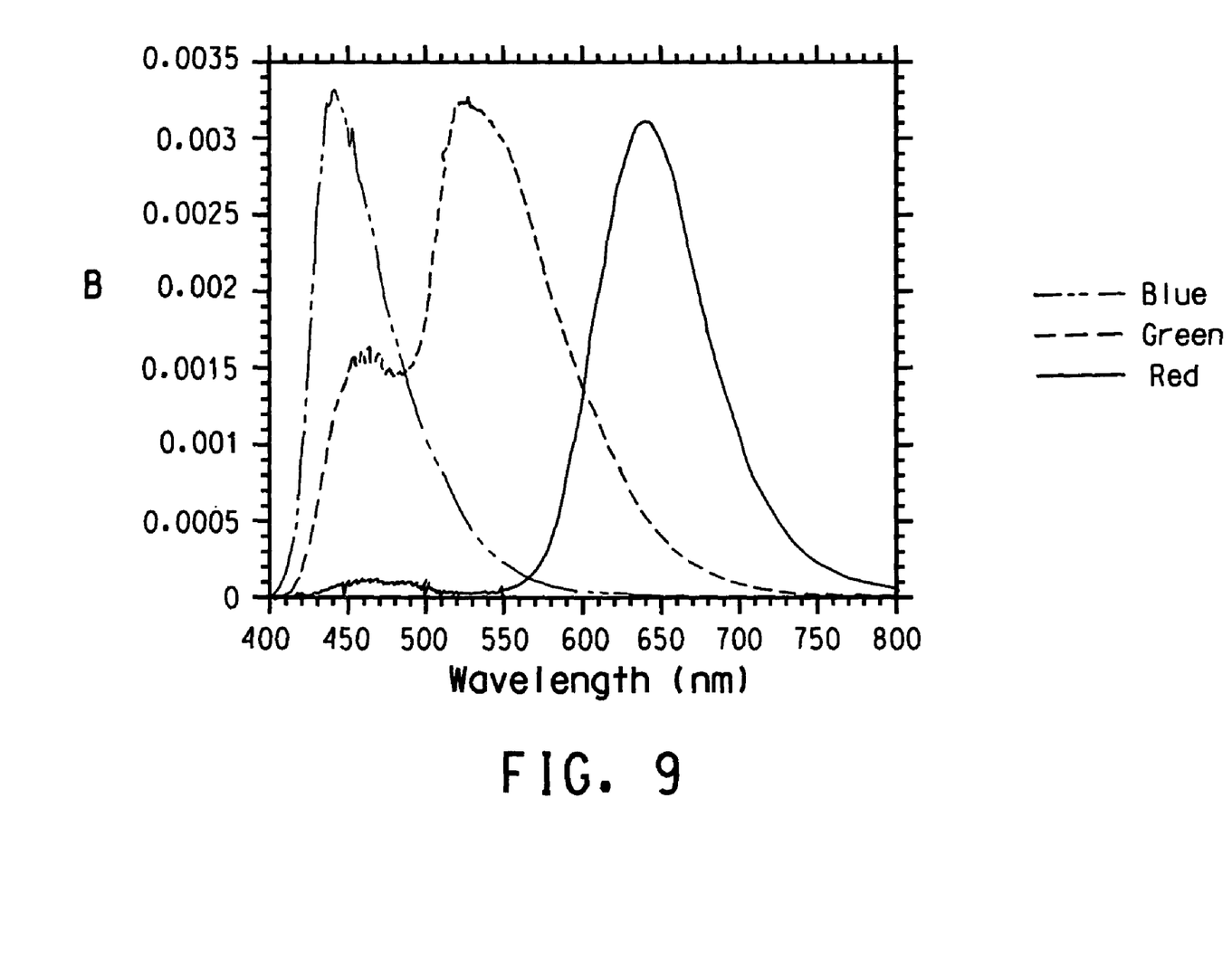
FIG. 9 illustrates EL emission spectra with single layer EL polymers doped with fluorescent dopants.

Column and row addressable, passive matrix OLED displays were fabricated following the procedure described in Example 2. After spin-coating the buffer layer and a polyspiro blue EL polymer layer (Blue-4), green and red molecular dopants were deposited into defined areas by means of a pair of shadow masks. In this experiment, Alq was used as an optional electron transport layer in the green and red zones. A Ca(5 nm)/Al(200 nm) double layer cathode was used in this Example. FIG. 9 shows the EL spectra of a full-color, passive matrix display made by this procedure. The testing results at 100 cd/m² are listed in Table 4. This example demonstrated that red and green pixels and full-color passive matrix displays can be made with blue polymer/dopant in a multi-layer structure.

TABLE 4

Pixel performance for (RGB) multi-layer device at 100 cd/m²

| Pixel ID | Structure | Voltage (V) | EL efficiency (cd/A) | EL Color |
|---|---|---|---|---|
| 5A | Blue-4/Ba/Al | 7.0 | 1.5 | blue |
| 5B | Blue-4/Alq:C545/Alq/Ba/Al | 4.9 | 4.4 | green |
| 5C | Blue-4/Alq:DCJTB/Alq/Ba/Al | 5.2 | 1.2 | red |

Example 6

Figure 10:
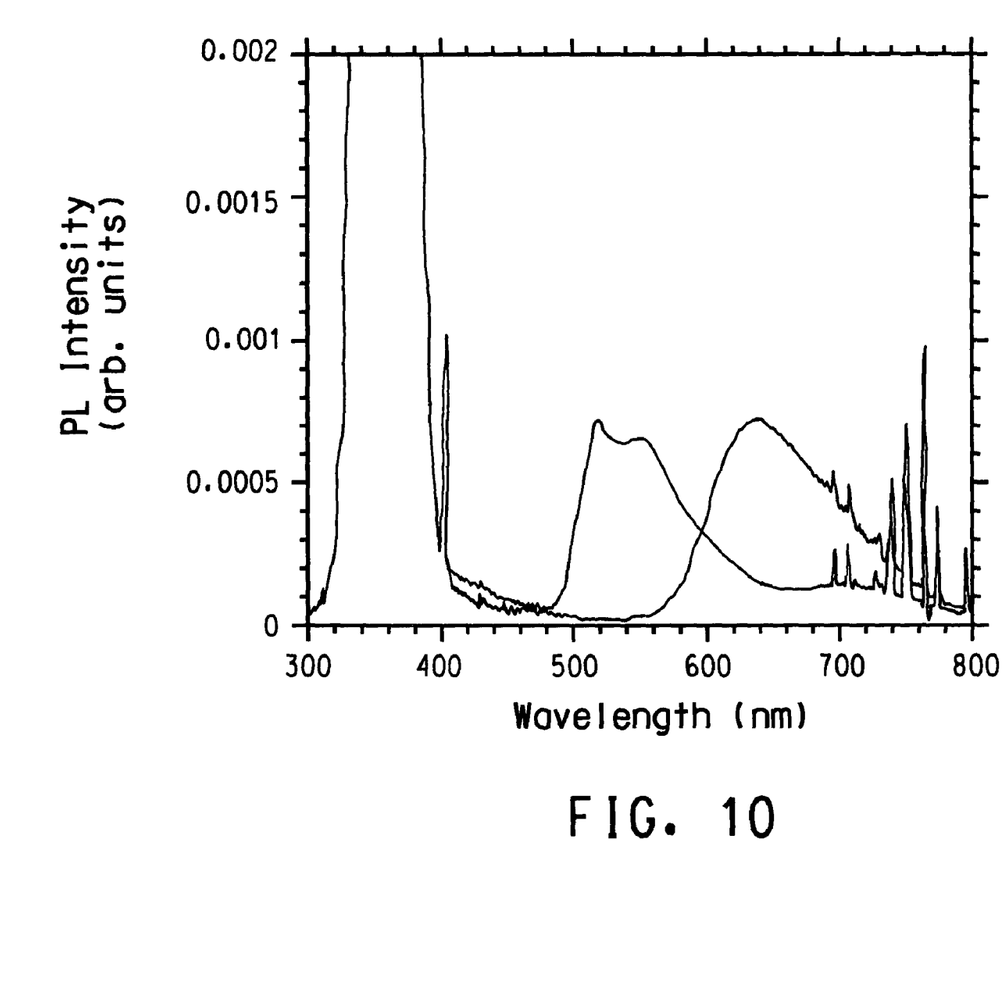
FIG. 10 illustrates photoluminescent spectra of CN-PPP/Dopants under UV illumination (emission in 300 to 400 nm range is due to the UV excitation source).

In this Example, Example 5 was repeated with the following modifications. After spin-coating a buffer layer and a blue EL polymer layer, green and red molecular dopants were vapor deposited into defined areas by means of a pair of shadow masks. The dopants were then diffused into the underlying blue EL polymer layer to form single green and red monolayers, by exposing the panel to organic solvent vapor. Exemplary solvent vapors that can be used for this purpose include xylene, toluene, chlorobenzene, etc., with a toluene vaporization temperature of 70° C. FIG. 10 shows PL emission spectra of the green and red subpixels. The spectral structure of the excitation source (saturated in 300–400 nm range) is also included. The corresponding photoluminescence images of the panel taken under UV illumination distinctly show the formation of red and green colors without residual blue emission spectra in the defined red and green zones, confirming the formation of both a red and a green polymer monolayers.

Example 7

In this Example, a device was fabricated as in Example 5, however, the dopant was diffused into the host layer by thermal treatment rather than diffusion from a wetting process. After spin-coating a buffer layer and a blue EL polymer layer, green and red molecular dopants were deposited into defined areas by means of a pair of shadow masks. The panel was then heated under vacuum, or under a $N_2$ or Ar atmosphere at 200° C. for 10 minutes. The formation of a red and green polymer blend monolayers was confirmed by PL imaging and PL spectra as in the previous example.

Example 8

Example 5 was repeated using an external biasing field for a diffusion process. After spin-coating the buffer layer and the blue EL polymer layer, green and red molecular dopants were deposited into defined areas by means of a pair of shadow masks, followed by cathode deposition. The diffusion of red and green dopants into the blue EL polymer layer was observed when the device was biased to a field of $1 \times 10^5$ V/cm. The formation of red and green polymer monolayers was confirmed by photoluminescence (PL) imaging and PL spectra after the biasing process.

Examples 6, 7 and 8 demonstrated that full-color displays can be made with dopant (fluorescent or phosphorescent) dispersed red and green molecules using various diffusion processes (thermal, solvent vapor and bias field) disclosed in this invention.

Example 9

Experiments in Examples 5–8 were repeated with active matrix substrates. Similar color performance was observed. These results demonstrated that the dopant coating and dispersion processes disclosed in this invention can be used for different types of substrates.

Example 10

Blue, green and red color pixels were fabricated as in Example 1. The substrate size was 4"×4". The active area was 3.2"×2.4" with 4" diagonal direction. The color pixel size was 100 pixels-per-inch (ppi) (equivalent to 254 µm). Blue subpixels were formed by spin-coating a blue EL polymer over the entire substrate. Red and green subpixels were formed by applying the corresponding red and green polymer solution drops into defined areas with a commercial ink-jetter made by MicroFab Technologies, Inc., (Plano, Tex.). Jetting green and red polymer solutions (1:1 ratio of p-xylene:anisole) into the corresponding subpixels produced green and red polymer blend monolayers automatically. This was confirmed by photoluminescence image and PL spectra.

This example demonstrated that high resolution, full-color display pixels can be fabricated by coating an un-patterned blue layer and ink-jetting green and red polymer solutions into the corresponding zones, similar to the process described in FIG. 1.

Example 11

Example 10 was repeated. The blue EL layer was formed by spin-coating a blue EL polymer over the entire panel. Red and green subpixels were formed by applying the corresponding EL dopant molecule solutions into defined areas. Ink-jetting green and red molecular dopant solutions into the corresponding zones forms green and red polymer monolayers automatically, as confirmed by photoluminescence imaging and PL spectra. This example demonstrated that high resolution, full-color display pixels can be fabricated by means of coating un-patterned blue layer and ink-jetting green and red EL dopant solutions into the corresponding zones.

Example 12

Example 10 was repeated. The blue EL layer was formed by spin-coating a blue EL polymer over the entire panel. Red and green subpixels were formed by depositing drops of polymer/molecular blend solutions made with a blue host polymer and green or red dopants (either fluorescent or phosphorescent molecules or polymers). Ink-jetting green and red polymer/molecular blend solutions into their corresponding zones formed green and red polymer/molecular blend monolayers automatically, as confirmed by photoluminescence imaging and PL spectra in green and red zones. This example demonstrated that high resolution, full-color display pixels can be fabricated by means of coating an un-patterned blue layer and drop-coating green and red polymer/molecule blend solutions into their corresponding zones.

Example 13

Example 10 was repeated with an active matrix substrate with pixel driver circuit embedded into each pixel. The physical dimensions of the color pixels and the corresponding subpixels were identical to that used in Example 10. A video rate, full-color, 320×240 QVGA (Quarter Video Graphics Array) active matrix PLED display was fabricated. This example demonstrated that high resolution, video rate (60 frames per second), full-color active matrix PLED displays can be fabricated using the method disclosed in this invention.

While the invention has been described in detail with reference to certain preferred embodiments thereof, it will be understood that modifications and variations are within the spirit and scope of that which is described and claimed.

What is claimed is:

1. A method for producing a full-color, subpixellated organic electroluminescent (EL) device comprising:
   a) providing a substrate,
   b) depositing an anode layer onto said substrate,
   c) establishing a plurality of discreet wells in sets of three on said substrate, wherein said discreet wells are formed by circumscribing walls to form said wells, wherein each well defines a subpixel and each set of three wells defines a pixel,
   d) depositing a buffer layer onto said anode layer in each of said wells,
   e) depositing an unpatterned EL host polymer layer selected to produce blue light in each of said wells,
   f) depositing a first patterned dopant layer selected to produce red light in a first well in at least one of said set of three wells without prior surface treatment of said walls of said well,
   g) depositing a second patterned dopant layer selected to produce green light in a second well in at least one of said set of three wells without prior surface treatment of said walls of said well,
   h) depositing a cathode layer,
thereby producing a full-color, subpixellated electroluminescent device.

2. A method according to claim 1, wherein said EL device is an active matrix full-color EL device.

3. A method according to claim 1, wherein said EL device is a passive matrix full-color EL device.

4. A method according to claim 1, wherein said walls circumscribe rectangular wells, circular wells, oval wells, or triangular wells.

5. A method according to claim 1, wherein said first and said second dopants are diffused into said EL host polymer layer to form monolayers in said wells.

6. A method according to claim 5, wherein said first and said second dopants are diffused into said EL host polymer layer by wetting of said host polymer layer by a polymer solution containing said first or said second dopant, by thermal diffusion, or by electric field biasing.

7. A method according to claim 5, wherein said first and said second dopants are diffused into said EL host polymer layer by wetting of said host polymer layer by a polymer solution containing said first or said second dopant.

8. A method according to claim 7, wherein said wetting produces a gradient density profile in said host polymer.

9. A method according to claim 1, wherein the method further comprises depositing an unpatterned EL organic layer that optionally emits blue light immediately prior to deposition of said cathode layer.

10. A method according to claim 1, wherein said anode layer is selected from mixed oxides of the Group 2 elements, the elements in Groups 4–6, and the elements in Groups 8–14.

11. A method according to claim 10, wherein said anode layer is selected from mixed oxides of the elements in Groups 12–14.

12. A method according to claim 10, wherein said anode layer is indium-tin oxide.

13. A method according to claim 1, wherein said deposition of said anode layer or said cathode layer is selected from a chemical vapor deposition process, a physical vapor deposition process, and a spin-cast process.

14. A method according to claim 13, wherein said chemical vapor deposition is selected from plasma-enhanced chemical vapor deposition ("PECVD") or metal organic chemical vapor deposition ("MOCVD").

15. A method according to claim 13, wherein said physical vapor deposition is selected from sputtering, e-beam evaporation, and resistance evaporation.

16. A method according to claim 13, wherein said physical vapor deposition is selected from rf magnetron sputtering and inductively-coupled plasma physical vapor deposition ("ICP-PVD").

17. A method according to claim 1, wherein said buffer layer is selected from polyaniline (PANI) or polyethylenedioxythiophene (PEDOT), wherein said buffer layer is optionally doped with a protonic acid.

18. A method according to claim 1, wherein said EL polymer layer is selected from polyparaphenylene vinylene (PPV), PPV copolymers. polyfluorenes, polyacetylenes, polyalkylthiophenes and derivatives thereof.

19. A method according to claim 1, wherein said dopants are functionalized polymers comprising functional groups coordinated to at least one metal.

20. A meted according to claim 19, wherein said functionalized polymer comprises functional groups selected from carboxylic acids, carboxylic acid salts, sulfonic acid groups, sulfonic acid salts, groups having an OH moiety, amine; imines, diimines, N-oxides, phosphines, phosphine oxides, and β-dicarbonyl groups.

21. A method according to claim 19, wherein said at least one metal is selected from lanthanide metals, Group 7 metals, Group 8 metals, Group 9 metals, Group 10 metals, Group 11 metals, Group 12 metals, and Group 13 metals.

22. A method according to claim 9, wherein said unpatterned EL organic layer is selected from metal-chelated oxinoid compounds, phenanthroline-based compounds, and azole compounds.

23. A method according to claim 22, wherein said unpatterned EL organic layer comprises $Alq_3$, 2,9-dimethyl-4,7-diphenyl-1,10-phenanthroline ("DDPA"), 4,7-diphenyl-1,10-phenanthroline ("DPA"), 2-(4-biphenylyl)-5-(4-t-butylphenyl)-1,3,4-oxadiazole ("PBD"), 3-(4-biphenylyl)-4-phenyl-5-(4-t-butylphenyl)-1,2,4-triazole ("TAZ"), or combinations of any one or more thereof.

24. A method according to claim 1, wherein said cathode layer comprises Group 1 metals, Group 2 metals, Group 12 metals, lanthanides, and actinides.

25. A method according to claim 1, wherein said deposition of said buffer layer, EL host polymer layer, and dopant is processed by means of solution casting, drop casting, curtain casting, spin-coating, screen printing, and inkjet printing.

26. An electroluminescent (EL) device produced by the method of claim 2.

* * * * *